(12) United States Patent
Lee et al.

(10) Patent No.: US 7,023,066 B2
(45) Date of Patent: Apr. 4, 2006

(54) SILICON MICROPHONE

(75) Inventors: Sung Bok Lee, Chicago, IL (US); Peter V. Loeppert, Hoffman Estates, IL (US)

(73) Assignee: Knowles Electronics, LLC., Itasca, IL (US)

( * ) Notice: Subject to any disclaimer, the term of this patent is extended or adjusted under 35 U.S.C. 154(b) by 994 days.

(21) Appl. No.: 09/989,513

(22) Filed: Nov. 20, 2001

(65) Prior Publication Data

US 2006/0006483 A1  Jan. 12, 2006

(51) Int. Cl.
*H01L 29/82* (2006.01)

(52) U.S. Cl. .......................................... 257/415; 438/53

(58) Field of Classification Search ................ 257/415, 257/416; 438/50, 52, 53
See application file for complete search history.

(56) References Cited

U.S. PATENT DOCUMENTS

| | | | |
|---|---|---|---|
| 4,420,790 A * | 12/1983 | Golke et al. ............. | 361/283.3 |
| 4,628,740 A | 12/1986 | Ueda et al. | |
| 4,776,019 A | 10/1988 | Miyatake | |
| 4,825,335 A | 4/1989 | Wilner ....................... | 361/283 |
| 4,908,805 A | 3/1990 | Sprenkels et al. .......... | 367/181 |
| 4,910,840 A | 3/1990 | Sprenkels et al. | |
| 5,146,435 A | 9/1992 | Bernstein .................... | 367/181 |
| 5,151,763 A | 9/1992 | Marek et al. | |
| 5,178,015 A | 1/1993 | Loeppert et al. ............... | 73/718 |
| 5,357,807 A | 10/1994 | Guckel et al. | |
| 5,408,731 A | 4/1995 | Berggvist et al. | |
| 5,449,909 A | 9/1995 | Kaiser et al. | |
| 5,452,268 A | 9/1995 | Bernstein .................... | 367/181 |
| 5,490,220 A | 2/1996 | Loeppert ..................... | 381/168 |
| 5,506,919 A | 4/1996 | Roberts | |
| 5,531,787 A | 7/1996 | Lesinski et al. | |
| 5,740,261 A | 4/1998 | Loeppert et al. | |
| 5,748,758 A | 5/1998 | Menasco, Jr. et al. | |
| 5,831,262 A | 11/1998 | Greywall et al. | |
| 5,870,482 A | 2/1999 | Loeppert et al. ............ | 381/174 |
| 5,939,968 A | 8/1999 | Nguyen et al. | |
| 6,012,335 A | 1/2000 | Bashir et al. .................. | 73/724 |
| 6,078,245 A | 6/2000 | Fritz et al. | |
| 6,108,184 A | 8/2000 | Minervini et al. | |
| 6,191,928 B1 | 2/2001 | Rector et al. | |
| 6,262,513 B1 | 7/2001 | Furukawa et al. | |
| 6,282,072 B1 | 8/2001 | Minervini et al. | |
| 2001/0029650 A1 | 10/2001 | Takata et al. | |
| 2002/0067663 A1 | 6/2002 | Loeppert et al. | |

FOREIGN PATENT DOCUMENTS

WO    WO 02/15636    2/2002

* cited by examiner

Primary Examiner—David Nelms
Assistant Examiner—Quoc Hoang
(74) Attorney, Agent, or Firm—Marshall, Gerstein & Borun LLP

(57) ABSTRACT

A solid-state transducer is disclosed. The transducer comprises a semi-conductor substrate forming a support structure and having an opening. A thin-film structure forming a diaphragm responsive to fluid-transmitted acoustic pressure is disposed over the opening. The transducer further includes a plurality of semi-conductor supports and tangential arms extending from the diaphragm edge for connecting the periphery of the diaphragm to the supports. The tangential arms permit the diaphragm to rotate relative to the supports to relieve film stress in the diaphragm. The transducer still further includes a plurality of stop bumps disposed between the substrate and the diaphragm. The stop bumps determine the separation of the diaphragm from the substrate when the transducer is biased.

33 Claims, 3 Drawing Sheets

US 7,023,066 B2

SILICON MICROPHONE

CROSS-REFERENCE TO RELATED APPLICATIONS

Not applicable.

FEDERALLY SPONSORED RESEARCH OR DEVELOPMENT

Not applicable.

TECHNICAL FIELD

The present invention relates to silicon microphones, and more particularly, to a silicon microphone having a diaphragm with reduced residual stress.

BACKGROUND OF THE INVENTION

Micro-electromechanical systems (MEMS) technology allows the manufacture of small (microns to hundreds of micron) electromechanical components using the precision manufacturing techniques of microelectronics. The term often used to describe MEMS manufacturing process is micromachining. Prime examples of MEMS devices on the market include pressure sensors and accelerometers. See L. Sprangler and C. J. Kemp, ISAAC-integrated silicon automotive accelerometer, in Tech. Dig. 8th Int. Conf. On Solid-State Sensors and Actuators (Transducers '95), Stockholm, June 1995, pp. 585–588. See also W. S. Czarnocki and J. P. Schuster. 1995. "Robust, Modular, Integrated Pressure Sensor," Proc 7th Intl Cong on Sensors, Nuremberg, Germany.

These devices typically consist of thin membranes and beams micromachined from films that are deposited or laminated on a substrate or, etched from the substrate itself. These micro-machined films ultimately serve as the mechanical structure and/or electrical connection. In the case where the film is deposited or laminated, a sacrificial layer is deposited first and then patterned using photolithography prior to film deposition or lamination. Patterning creates regions on the substrate that are free of the sacrificial layer and, thus the film can be deposited directly onto the substrate, i.e. anchored to the substrate. After the film has been micro-machined to a desired structure, the portion of the structure that is not anchored to the substrate is physically separated or disconnected from the substrate by removing the sacrificial layer underneath the micromachined structure.

One major difficulty often encountered in micromachining is the control of film stress. Film stress is the residual stress that is present in the film after formation. For the case of tensile film stress, the resulting micromachined structure will also be in tensile stress unless the micromachined structure is designed to strain and relieve the stress. Micromachined cantilevers are a typical example of a structure that can relieve the residual stress.

For a MEMS microphone (condenser microphone), the part of the micromachined structure that actuates with an acoustic signal is the diaphragm. Stress on the diaphragm has a direct effect on the sensitivity of the microphone. Tensile stress severely decreases the mechanical compliance of a microphone diaphragm. The following idealized formula shows that decreasing the mechanical compliance decreases the sensitivity of a capacitor microphone:

$$Sens = \frac{C_{MS} S E}{x_0}$$

Here, $C_{MS}$ is the mechanical compliance in meters per Newton; S is the area; E is the bias; $x_0$ is the distance between the microphone diaphragm and back plate; and Sens is the open circuit sensitivity of the microphone. It is clear, that in order to fabricate MEMS microphones whose sensitivity is minimally affected by the film stress, the diaphragm must be designed such that film stress minimally affects its mechanical compliance. One must keep in mind that the diaphragm is fabricated from the very film which holds the residual stress.

One method of minimizing the effect of film stress is the free plate scheme. See Loeppert et al., Miniature Silicon Condenser Microphone, U.S. Pat. No. 5,490,220 and PCT application 01/25184, filed Aug. 10, 2001 (claiming priority from U.S. Ser. Nos. 09/637,401 and 09/910,110). In this method, the diaphragm is largely free with the exception of a narrow arm or arms. The function of the narrow arm is simply to provide an electrical connection to the diaphragm. This way the mechanically free diaphragm is allowed to strain and release the residual stress. Since the diaphragm is not rigidly attached to the substrate, it is necessary to mechanically confine the diaphragm on the substrate to prevent the diaphragm from detaching completely while handling. For the free plate design, the diaphragm hovers over an acoustic port that has been etched into the substrate (the substrate opening, which serves as the acoustic port, is smaller than the diaphragm diameter). In the free plate design, the back plate covers the diaphragm and provides the necessary confinement. Thus the diaphragm is confined by the substrate and the back plate located on either side of the diaphragm.

Implementing a microphone diaphragm design such as the free plate design is possible by using a fabrication process that is capable of depositing many conformal layers of thin film (See the above referenced PCT application).

In some microphone implementations, it is desirable to place the backplate between the diaphragm and the substrate. In other devices, there may not be a backplate at all. In these situations, there is insufficient constraints to keep the free plate diaphragm from being pulled away from the substrate and being damaged during processing or when handling a completed device. This invention describes a means to protect the diaphragm by constraining its out of plane travel yet which will strain to relieve in-plane stresses.

SUMMARY OF THE INVENTION

In order to simplify the fabrication process it is necessary to combine the functionality of some of the mechanical structures. According to the invention, a diaphragm anchoring scheme is provided which renders the diaphragm essentially free, i.e., the film stress is relieved and yet, the entire diaphragm is anchored in place on the substrate. This diaphragm design can be used for fabricating MEMS microphones with characteristic acoustic sensitivity that is relatively insensitive to the (diaphragm) residual film stress. In this design, the insensitivity of the diaphragm's compliance to residual film stress is achieved through the special anchoring scheme. Since the diaphragm is physically anchored or attached to the support substrate, no additional structure is required to contain the diaphragm. Hence the fabrication method is simpler than the free plate design described in the previous section.

Thus it is an object of the invention to provide a transducer.

In accordance with the invention, the transducer comprises a substrate forming a support structure and having an opening. The substrate can be formed of a conductive material or of a semi-conductor material, such as silicon, provided the substrate has an appropriately insulating film layer. Alternatively, the substrate can be formed of a wholly electrically insulating material. A thin-film structure forming a diaphragm responsive to fluid-transmitted acoustic pressure is disposed over the opening. The transducer further includes a plurality of supports and means for connecting the periphery of the diaphragm to the supports. The connecting means strains to permit the diaphragm to move to relieve film stress in the diaphragm. The transducer still further includes a plurality of stop bumps disposed between the substrate and the diaphragm. The stop bumps determine the separation of the diaphragm from the substrate when the transducer is biased.

It is contemplated that the transducer is a microphone.

It is further contemplated that the stop bumps are fabricated either from an insulating material or from a conductive material having an outer layer of insulating material.

It is still further contemplated that each of the stop bumps is anchored to the substrate and not to the diaphragm, or each of the stop bumps is anchored to the diaphragm and not to the substrate.

It is yet further contemplated that the connecting means comprises a plurality of arms extending generally tangentially outwardly from the diaphragm edge.

It is still further contemplated that the transducer includes a back plate, that the back plate is smaller than the diaphragm and the center of the back plate is aligned with the center of the diaphragm to minimize parasitic capacitance.

BRIEF DESCRIPTION OF THE DRAWINGS

Other objects, features and advantages will occur to those skilled in the art from the following description and the accompanying drawings, in which.

DETAILED DESCRIPTION OF THE INVENTION

Figure 1:
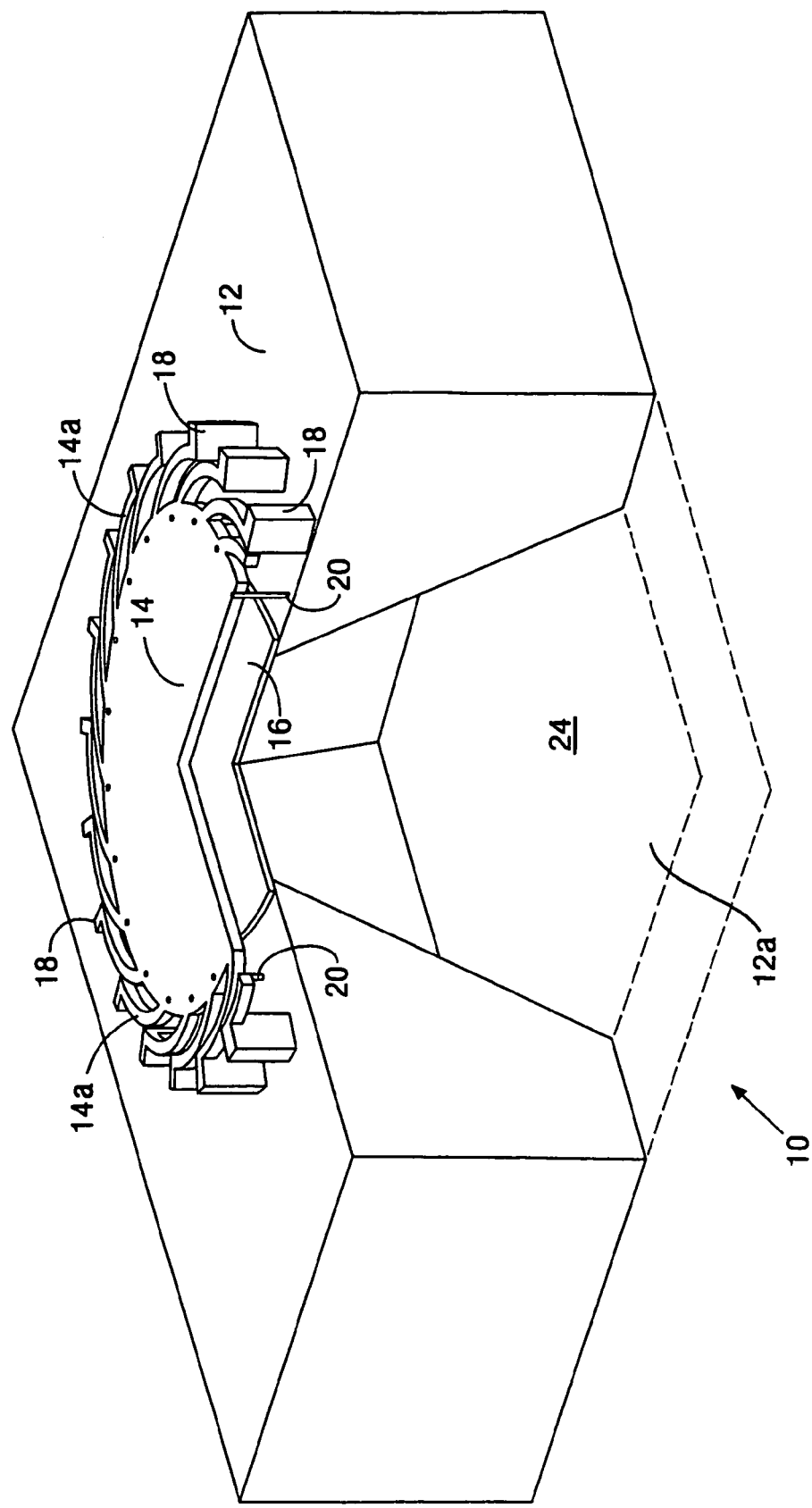
FIG. 1 is a cutaway perspective view of a transducer according to the invention.

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

A solid-state transducer 10 according to the invention is illustrated in FIG. 1. In the present description, the transducer 10 is shown as a condenser microphone. However, the transducer could be other devices, such as a pressure sensor or an accelerometer. The transducer 10 comprises a semiconductor substrate 12 forming a support structure and having an opening 12a. The transducer 10 further includes a thin-film structure forming a diaphragm 14 responsive to fluid-transmitted acoustic pressure. The diaphragm 14 is disposed over the opening 12a. The diaphragm 14 includes a plurality of tangentially extending arms 14a. A back plate 16 is attached to the substrate 12, which has been coated with an insulating material. The back plate 16 may be formed of the same silicon as the substrate 12.

The transducer 10 further includes a plurality of semiconductor supports 18 coupling each of the arms 14a to the substrate 12. A plurality of stop bumps 20 are disposed between the substrate 12 and the diaphragm 14. The stop bumps 20 determine the separation of the diaphragm 14 from the substrate 12, and hence the backplate 16, when the transducer 12 is biased. A back volume 24 can be located underneath the back plate 16 and may be defined by using the substrate opening 12a to cover an open-ended cavity.

Figure 2:
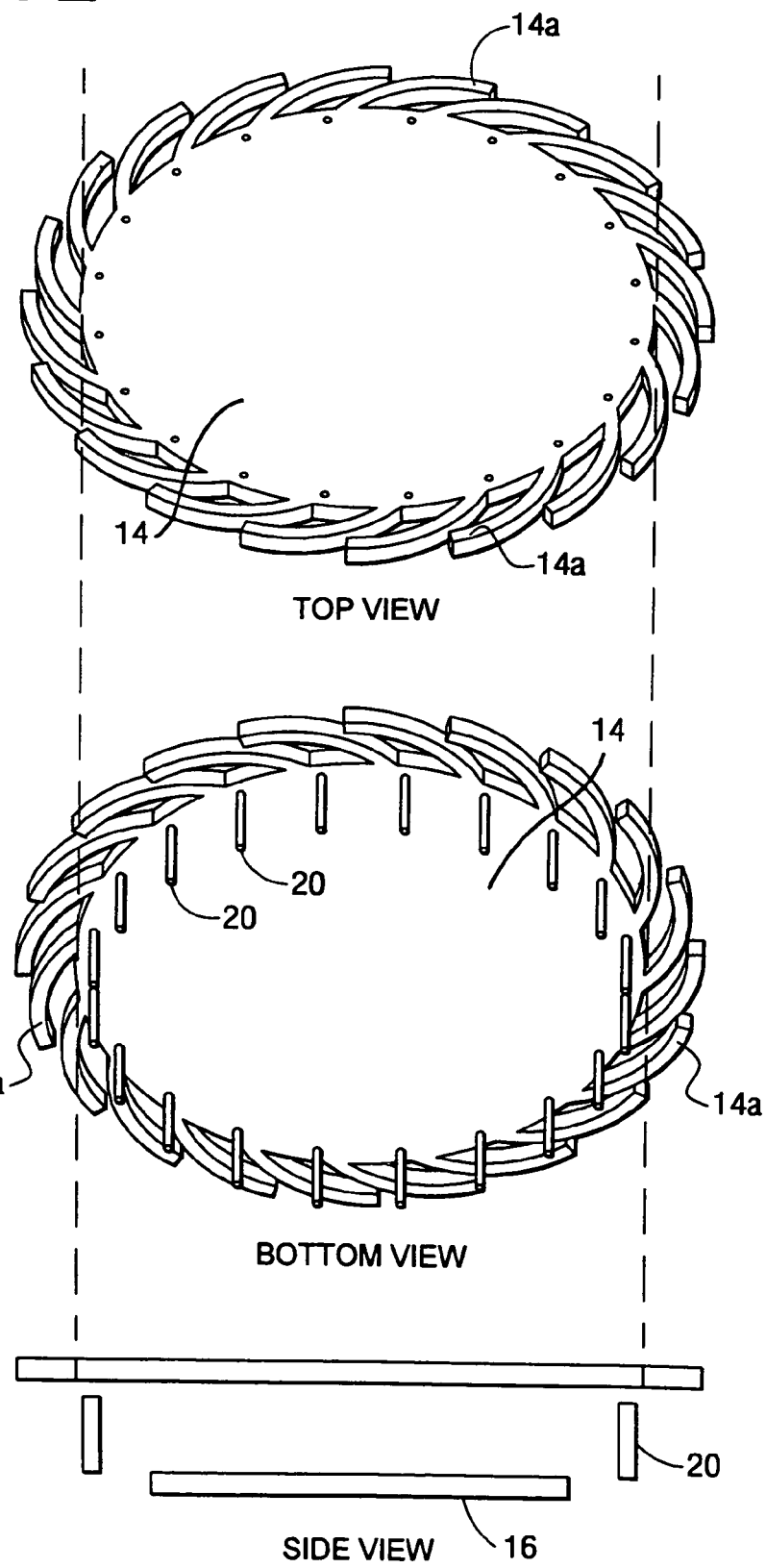
FIG. 2 is a top, bottom and side view of a diaphragm for the transducer of FIG. 1.

Three different views of the diaphragm 14 are illustrated in FIG. 2. The top view shows the diaphragm 14 anchored to the substrate 12 via the spiral arms 14a. When the entire structure is released from the substrate 12 (with the exception of the anchor points), the spiral arms 14a strain and thus relieve the build-in film stress in the diaphragm 14. The entire diaphragm 14, including the spiral arms 14a, is a conductor which may be doped silicon, poly-silicon, or silicon-germanium.

The bottom view of FIG. 2 shows the stop bumps 20. The stop bumps 20 are fabricated from an insulator. Alternatively, the stop bumps 20 are a conductor with an outer insulating layer.

In the preferred embodiment, the transducer 10 has twenty of the stop bumps 20. Each of the stop bumps 20 is anchored to the substrate 12 and is not attached to the diaphragm 14 located just above the bumps. Having the stop bumps 20 not attached to the diaphragm 14 allows the diaphragm 14 to move when relieving the film stress. The stop bumps 20 serve as controlled boundary condition when the diaphragm 14 is responding to sound waves and when the diaphragm 14 is biased. Specifically, the stop bumps provide a simply supported boundary to the stress-relieved diaphragm 14 and also determine the nominal distance between the diaphragm 14 and the back plate 16 when the transducer 10 is biased. The distance between the top of the bumps 20 and the bottom of the diaphragm 14 when the diaphragm 14 is not biased, as well as the diameter of the bumps 20, depend on the available fabrication technology.

The acoustic path, or leak, defined by a path from the ambient to the back volume which is surrounded by the bumps 20, the diaphragm 14 and the substrate 12, is necessary in order to accommodate varying ambient pressure. In order to control the acoustic resistance of this leak, additional bumps 20 may be placed underneath the diaphragm 14 or at the perimeter of the diaphragm 14 to restrict the acoustic leak from ambient to the back volume 24. Alternatively, the gap set by the height of the bumps 20 can be adjusted, or the overlap of the diaphragm 14 and the substrate hole can be changed.

The side view on the bottom of FIG. 2 shows the location of the back plate 16. The back plate 16 is a conductor. The back plate 16 may be perforated with holes or slots to provide desired damping of the movement of the diaphragm 14 when actuating and to lower the acoustic noise. The back plate 16 must be much thicker or stiffer than the diaphragm 14. In addition, the back plate 16 must be smaller than the diaphragm 14, and the center of the back plate 16 must be aligned to the center of the diaphragm 14 in order to minimize parasitic capacitance.

Referring again to FIG. 1, the substrate 12 is shown having a tapered hole, or acoustic port. This is characteristic of silicon anisotropic etching and is commonly found in bulk micro-machined silicon structures. The thickness of the diaphragm 14 is exaggerated for visual clarity. As stated previously, the back plate must be much thicker (or stiffer) than the diaphragm.

FIG. 1 shows the diaphragm 14 anchored to the substrate 12 at the end of the spiral arms 14a. The substrate 12 is coated with a layer of insulator to avoid electrical shorting of the back plate 16 and the diaphragm 14. An electrical connection (not shown) is provided to both the back plate 16 and the diaphragm 14. The electrical connection may be achieved trivially using conducting runners. Therefore, electrical connections are not shown in the FIGS.

For operation as a microphone, the transducer 10, as shown in FIG. 1, is placed over a hole in a cavity with a known back volume. The diaphragm 14 is then electrically biased against the back plate 16. The spiral arms 14a, which anchor the diaphragm 14, allow the diaphragm 14 to be nearly stress free before biasing. Upon biasing, the diaphragm 14 rests against the bumps 20. On exposure of the diaphragm 14 to sound waves, actuation of the diaphragm 14 occurs, and the electrical signal generated by the moving diaphragm center is detected using a high impedance amplifier. As stated above, the back plate 16 is stiffer than the diaphragm 14. Actuating the diaphragm 14 and the stationary back plate 16 forms a variable capacitor, where the variance of the capacitance is induced by the acoustic signal.

Figure 3:
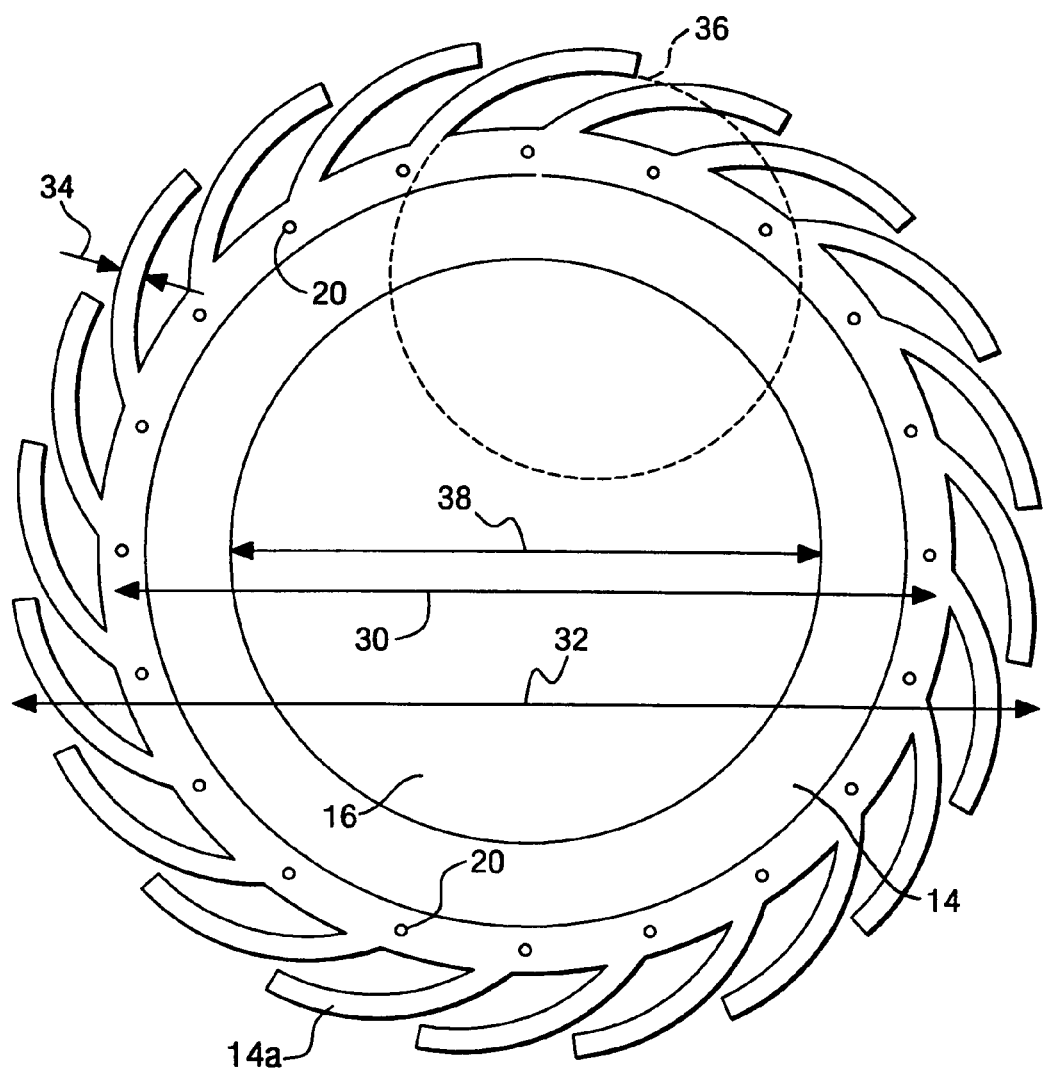
FIG. 3 is a top view of the transducer of FIG. 1.

FIG. 3 shows the geometrical dimensions of a version of the microphone that incorporated the diaphragm design. This is a top view of the diaphragm 14. The diaphragm 14 has an effective diameter 30 of 550 µm. The diaphragm 14, including the tangential arms 14a, has a total diameter 32 of 710 µm. Each tangential arm 14a has a width 34 of 16 µm., and a radius of curvature 36 of 150 µm. The back plate 16 has a diameter 38 of 400 µm, and the distance between the diaphragm 14 and the back plate 16 is 4 µm. The outline of the back plate 16 located underneath the diaphragm 14 is also shown in FIG. 3. As stated earlier, the diameter of the back plate 16 is smaller than the diameter of the diaphragm 14 to minimize the parasitic capacitance.

While the specific embodiments have been illustrated and described, numerous modifications come to mind without significantly departing from the spirit of the invention and the scope of protection is only limited by the scope of the accompanying claims.

We claim:

1. A solid-state transducer comprising:
    a substrate forming a support structure and having an opening;
    a thin-film structure forming a diaphragm responsive to fluid-transmitted acoustic pressure and disposed over the opening;
    a plurality of supports;
    means for connecting the periphery of the diaphragm to the supports, wherein the connecting means strains to permit the diaphragm to move relative to the supports to relieve film stress in the diaphragm; and
    a plurality of stop bumps disposed between the substrate and the diaphragm, the stop bumps determining the separation of the diaphragm from the substrate when the transducer is biased.

2. The transducer of claim 1 wherein the substrate is formed of a semi-conductor.

3. The transducer of claim 2, wherein the semi-conductor is silicon.

4. The transducer of claim 1, wherein the transducer is a microphone.

5. The transducer of claim 1 wherein the stop bumps are fabricated from an insulating material.

6. The transducer of claim 1 wherein the stop bumps are fabricated from a conductive material having an outer layer of insulating material.

7. The transducer of claim 1 including twenty of the stop bumps.

8. The transducer of claim 1 wherein each of the stop bumps is anchored to the substrate and not to the diaphragm.

9. The transducer of claim 1 wherein each of the stop bumps is anchored to the diaphragm and not to the substrate.

10. The transducer of claim 1 wherein the connecting means comprises a plurality of arms extending tangentially from the diaphragm edge.

11. The transducer of claim 10 wherein the arms are generally arcuate.

12. The transducer of claim 1 including a back plate, wherein the back plate is smaller than the diaphragm and the center of the back plate is aligned with the center of the diaphragm to minimize parasitic capacitance.

13. The transducer of claim 1 including a backplate disposed between the substrate and the diaphragm, and wherein the stop bumps determine the separation of the diaphragm from the backplate when the transducer is biased.

14. A solid-state transducer comprising:
    a semi-conductor substrate forming a support structure and having an opening;
    a thin-film structure forming a diaphragm responsive to fluid-transmitted acoustic pressure and disposed over the opening, the diaphragm including a plurality of tangentially extending arms;
    a plurality of semi-conductor supports coupling each of the arms to the substrate; and
    a plurality of stop bumps disposed between the substrate and the diaphragm, the stop bumps determining the separation of the diaphragm from the substrate when the transducer is biased.

15. The transducer of claim 14, wherein the transducer is a microphone.

16. The transducer of claim 14 wherein the stop bumps are fabricated from an insulating material.

17. The transducer of claim 14 wherein the stop bumps are a fabricated from a conductive material having an outer layer of insulating material.

18. The transducer of claim 14 including twenty of the stop bumps.

19. The transducer of claim 14 wherein each of the stop bumps is anchored to the substrate and not to the diaphragm.

20. The transducer of claim 14 wherein each of the stop bumps is anchored to the diaphragm and not to the substrate.

21. The transducer of claim 14 including a back plate, wherein the back plate is smaller than the diaphragm and the center of the back plate is aligned with the center of the diaphragm to minimize parasitic capacitance.

22. The transducer of claim 14 including a backplate disposed between the substrate and the diaphragm, and wherein the stop bumps determine the separation of the diaphragm from the backplate when the transducer is biased.

23. A solid-state transducer comprising:
    a semi-conductor substrate forming a support structure and having an opening;
    a thin-film structure forming a diaphragm responsive to fluid-transmitted acoustic pressure and disposed over the opening;

a plurality of semiconductor supports; and means for connecting the periphery of the diaphragm to the supports, wherein the connecting means strains to relieve film stress in the diaphragm.

24. The transducer of claim 23 including a plurality of stop bumps disposed between the substrate and the diaphragm, the stop bumps determining the separation of the diaphragm from the substrate when the transducer is biased.

25. The transducer of claim 23, wherein the transducer is a microphone.

26. The transducer of claim 23 wherein the stop bumps are fabricated from an insulating material.

27. The transducer of claim 23 wherein the stop bumps are fabricated from a conductive material having an outer layer of insulating material.

28. The transducer of claim 23 including twenty of the stop bumps.

29. The transducer of claim 23 wherein each of the stop bumps is anchored to the substrate and not to the diaphragm.

30. The transducer of claim 23 wherein each of the stop bumps is anchored to the diaphragm and not to the substrate.

31. The transducer of claim 23 wherein the connecting means comprises a plurality of arms extending tangentially outwardly from the diaphragm.

32. The transducer of claim 23 including a back plate, wherein the back plate is smaller than the diaphragm and the center of the back plate is aligned with the center of the diaphragm to minimize parasitic capacitance.

33. The transducer of claim 23 including a backplate disposed between the substrate and the diaphragm, and wherein the stop bumps determine the separation of the diaphragm from the backplate when the transducer is biased.

* * * * *

UNITED STATES PATENT AND TRADEMARK OFFICE
CERTIFICATE OF CORRECTION

PATENT NO.        : 7,023,066 B2
APPLICATION NO.   : 09/989513
DATED             : April 4, 2006
INVENTOR(S)       : Sung B. Lee et al.

It is certified that error appears in the above-identified patent and that said Letters Patent is hereby corrected as shown below:

At Column 6, line 45, "a fabricated" should be -- fabricated --,

At Column 6, line 58 "backplate" should be -- back plate --,

At Column 6, line 61 "backplate" should be -- back plate --,

At Column 8, line 12 "backplate" should be -- back plate --,

At Column 8, line 15 "backplate" should be -- back plate --.

Signed and Sealed this

Second Day of January, 2007

JON W. DUDAS
*Director of the United States Patent and Trademark Office*